United States Patent [19]
Straight et al.

[11] Patent Number: 5,567,650
[45] Date of Patent: Oct. 22, 1996

[54] METHOD OF FORMING TAPERED PLUG-FILLED VIA IN ELECTRICAL INTERCONNECTION

[75] Inventors: John B. Straight, Crystal; Daniel W. Youngner, Maple Grove; James C. Anderson, Columbia Heights, all of Minn.

[73] Assignee: Honeywell Inc., Minneapolis, Minn.

[21] Appl. No.: 356,421

[22] Filed: Dec. 15, 1994

[51] Int. Cl.⁶ .................................................. H01L 21/28
[52] U.S. Cl. ...................... 437/195; 437/192; 437/194; 437/947; 437/981
[58] Field of Search ............................. 437/192, 195, 437/947, 981, 194; 148/DIG. 161

[56] References Cited

U.S. PATENT DOCUMENTS

| | | | |
|---|---|---|---|
| 5,231,051 | 7/1993 | Baldi et al. | 437/192 |
| 5,269,880 | 12/1993 | Jolly et al. | 437/981 |
| 5,284,799 | 2/1994 | Sato | 437/195 |
| 5,320,979 | 6/1994 | Hashimoto et al. | 437/981 |
| 5,320,981 | 6/1994 | Blalock | 437/195 |

FOREIGN PATENT DOCUMENTS 04003921  1/1992  Japan.

OTHER PUBLICATIONS

"Silicon Processing for the VLSI Era, vol. 2", S. Wolf, Lattice Press 1990, p. 191.
S. Wolf, "Silicon Processing for the VLSI Era, vol. 1", Lattice Press 1986, pp. 569–573.

*Primary Examiner*—George Fourson
*Assistant Examiner*—Thomas G. Bilodeau
*Attorney, Agent, or Firm*—Gregory A. Bruns

[57] ABSTRACT

A process for contouring a via formed in a dielectrics whereby a layer of a refractory metal is formed on the dielectric and in the via. The refractory metal layer is removed until a surface of the refractory metal within the via is below the upper surface of the dielectric. An etching process removes a portion of the dielectric and a tapered shape is formed at the intersection of the via and the upper surface of the dielectric. A second layer of metal is formed over the dielectric, with the second layer of metal extending into the vias and contacting the refractory metal with the tapered shape providing improved step coverage of the second layer of metal at the via.

13 Claims, 3 Drawing Sheets

5,567,650

METHOD OF FORMING TAPERED PLUG-FILLED VIA IN ELECTRICAL INTERCONNECTION

BACKGROUND OF THE INVENTION

The present invention relates to the field of electrical interconnections in semiconductor devices and more particularly to a process for improved step coverage of metal into plug filled vias. Semiconductor devices typically include vias of uniform cross section extending through an insulator or dielectric which when filled with metal become plugs which interconnect layers of an integrated circuit. The vias extend through an insulating layer or dielectric such as silicon dioxide and typically form a square corner at the intersection of the via with the dielectric. The practical removal of the metal layer used to form the plug requires that the metal be etched below the upper surface of the dielectric. The successful deposition of a second metal layer on the dielectric to contact the plugs requires that good step coverage is achieved at the vias. In the past it has been difficult to achieve this good step coverage, i.e., there is often excessive thinning of the second metal layer which can cause various problems. Thus a need exists for a process that reduces the difficulty of achieving good step coverage of metal into plug filled vias.

SUMMARY OF THE INVENTION

The present invention solves these and other needs by providing a process for forming an electrical interconnection system on a semiconductor, comprising the steps of providing a semiconductor substrate having an interconnection site, and forming an insulating layer on the semiconductor substrate; selectively etching a via in the insulating layer at the interconnection site; forming a layer of a refractory metal on the insulating layer and in the via; removing the refractory metal layer until a surface of the refractory metal within the via is below the upper surface of the insulating layer; performing an etching process which removes a portion of the first insulating layer and whereby a tapered shape is formed at an intersection of the via and the upper surface of the insulating layer; and forming a second layer of metal over the insulating layer, with the second layer of metal extending into the vias and contacting the refractory metal with the tapered shape providing improved step coverage of the second layer of metal at the via.

DETAILED DESCRIPTION OF THE DRAWINGS

Figure 1:
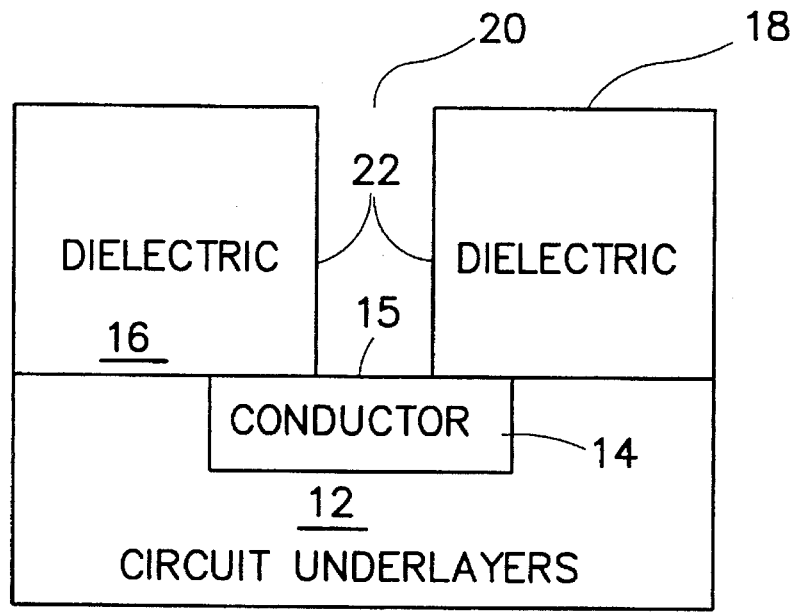
FIG. 1 is a cross sectional view of a substrate having circuit underlayers, a conductor, and a dielectric layer with a via extending to the conductor.
Figure 2:
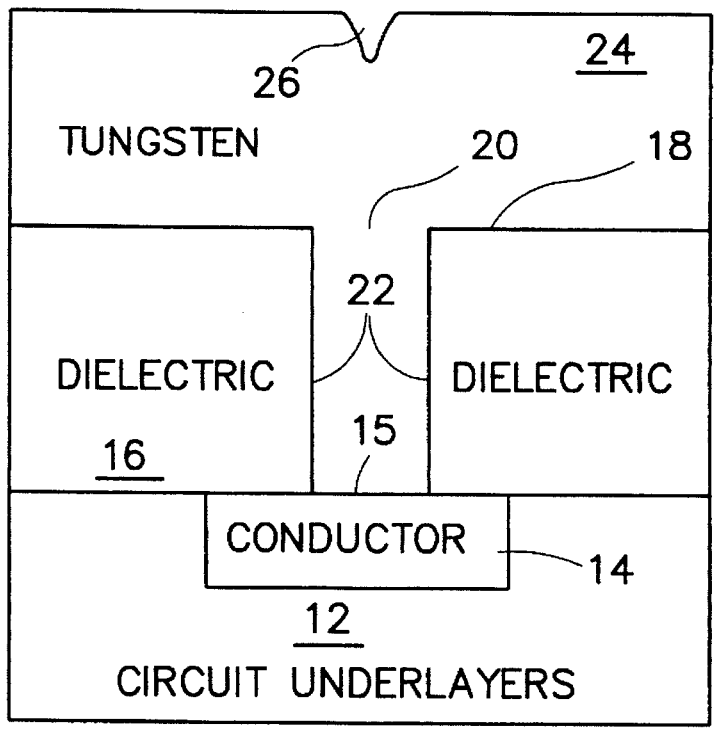
FIG. 2 illustrates the structure of FIG. 1 with a refractory metal formed thereon.

FIG. 1 shows semiconductor substrate 12, which would include circuit underlayers (not shown), an interlevel metal layer 14 and dielectric layer 16 having an upper surface 18. Dielectric 16 may be for example silicon dioxide or silicon nitride. Via 20 extends through dielectric layer 16 to interlevel metal layer 14 and is formed using well known prior art photolithographic and etching techniques. Via 20 exhibits straight sidewalls 22 as is typical in VLSI fabrication to achieve maximum circuit density. Via 20 is to be filled with tungsten so that electrical contact can be made to interlevel metal 14 at interconnection 15. Interconnection 15 could also be a portion of semiconductor substrate 12 rather than interlevel 14. It is understood that there will be many vias 20 formed in dielectric 16, but only one is shown in the FIGS. for simplicity. FIG. 2 shows the device of FIG. 1 after deposition of tungsten layer 24. Because deposition of tungsten occurs on sidewalls 22 and the bottom of via 20, only a small depression 26 results in tungsten 24.

Figure 3:
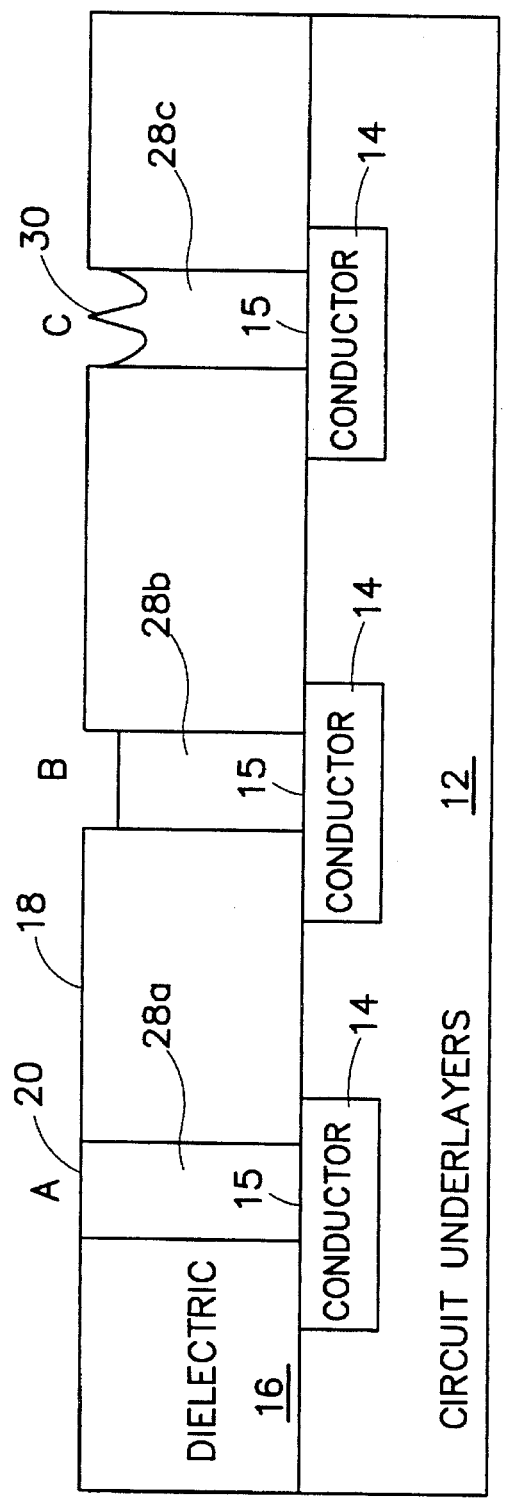
FIG. 3 illustrates the structure of FIG. 2 after etchback of the refractory metal from the dielectric leaving the vias containing the refractory metal.

Tungsten layer 24 is next etched back by well known etching means. Tungsten as deposited tends to be a very grainy film and if one were to stop the tungsten etch just as it reaches surface 18 of dielectric 16, then there would still be tungsten laying on surface 18. In practice, the etching must extend further to clear grains of tungsten from surface 18. FIG. 3 shows a set of typical contours, designated "A" "B" and "C" for tungsten plugs 28 after tungsten etchback. Because of the need to clear surface 18 of residual tungsten, the contour "A" of FIG. 3 is not realistic and does not occur in practice. Contour "B" will provide for some overetching to clear surface 18 of residual tungsten and contour "B" may occur in practice. However the inherent nature of the tungsten via filling process and the tungsten etchback process will frequently result in contour "C" which can be explained as follows. As tungsten is deposited, it will gradually fill from the bottom and sides of via 20, so that there is a remaining vertical opening spaced from the sidewalls. The surface of the tungsten during deposition, including the surface at the remaining vertical opening, tends to be filled with contaminants such as oxygen. As deposition proceeds the remaining vertical opening becomes smaller and eventually closes. The plug that is formed then has only tungsten at its outer portions, but the center or core includes some tungsten oxide. When the plasma etchback of tungsten layer 24 takes place, the outer tungsten portion of the plug 28c etches at an even rate, but the tungsten oxide portion etches at a slower rate. This explains the spike formation 30 shown in contour "C" of FIG. 3.

Figure 4:
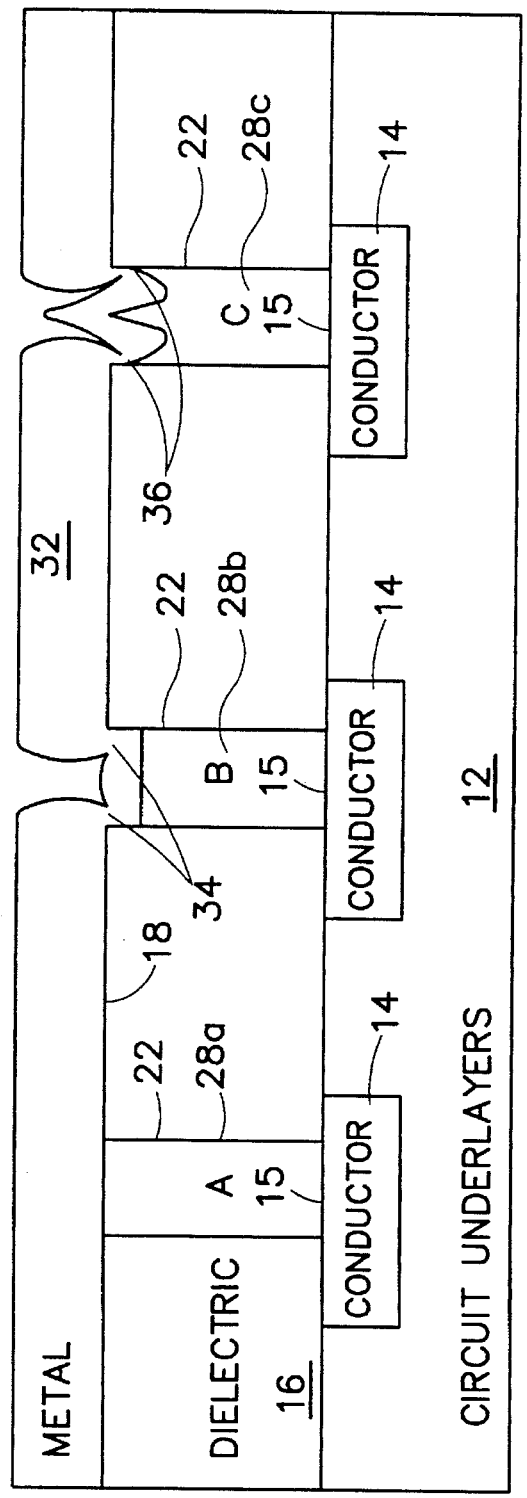
FIG. 4 illustrates the structure of FIG. 3 after depositing an additional layer of metal.

The next step is the deposition of a metal layer 32 which is typically an aluminum alloy such as aluminum copper. FIG. 4 shows the metal coverage into the plugs shown in FIG. 3 with the metal coverage designated "A", "B", and "C". The concept of step coverage is a ratio of the thinnest point of the metal divided by the thickest point. Low step coverage values are undesirable due to electromigration issues and a minimum specification for step coverage typically must be satisfied. Applying this concept to FIG. 4, the coverage of "A" is uniform and there is no thinning. The coverage of "B" is not as good with thin points 34 occurring on the inside edges of via sidewalls 22. The coverage of "C" is the worst since the plug's surface tends to drive the metal to very thin points 36 near the inside edges of via sidewalls 22.

The present invention employs a process step called "tapering". To taper a via, the wafers containing plug filled vias of FIG. 3 are subjected to a sputter etch typically done in an inert gas, such as argon. The sputter etch removes anywhere from several hundred to several thousand angstroms of material under conditions where corners of features etch faster than flat features or sidewalls. The present invention provides for an etching period sufficient to provide the desired tapered shape to the vias. In one batch wafer processing system, an etching period of approximately 45 minutes has been used with good results. A single wafer etching system may require less than a minute to produce the desired tapered shape or contour.

Figure 5:
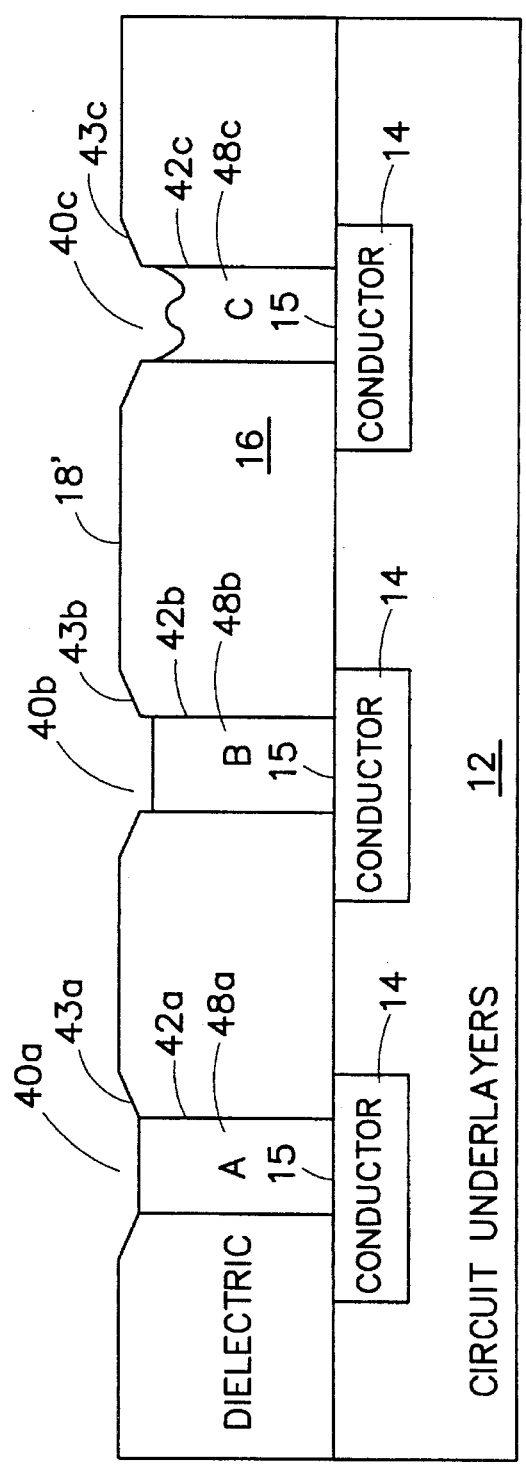
FIG. 5 illustrates the structure of FIG. 3 after performing the etching of the present invention.

FIG. 5 shows the vias 20, now designated 40, and plugs 28, now designated 48, similar to those of FIG. 3 after being conditioned by the taper process of the present invention. Note that in all cases, the via has both a uniform cross section portion and a non uniform or outwardly tapered portion. For example, for contour "B", the portion of via 40b having a uniform cross section has vertical sidewall portion 42b and the portion having a non uniform cross section has an angled sidewall 43b which gives via 40b an outward taper where it meets upper surface 18' of dielectric 16.

Figure 6:
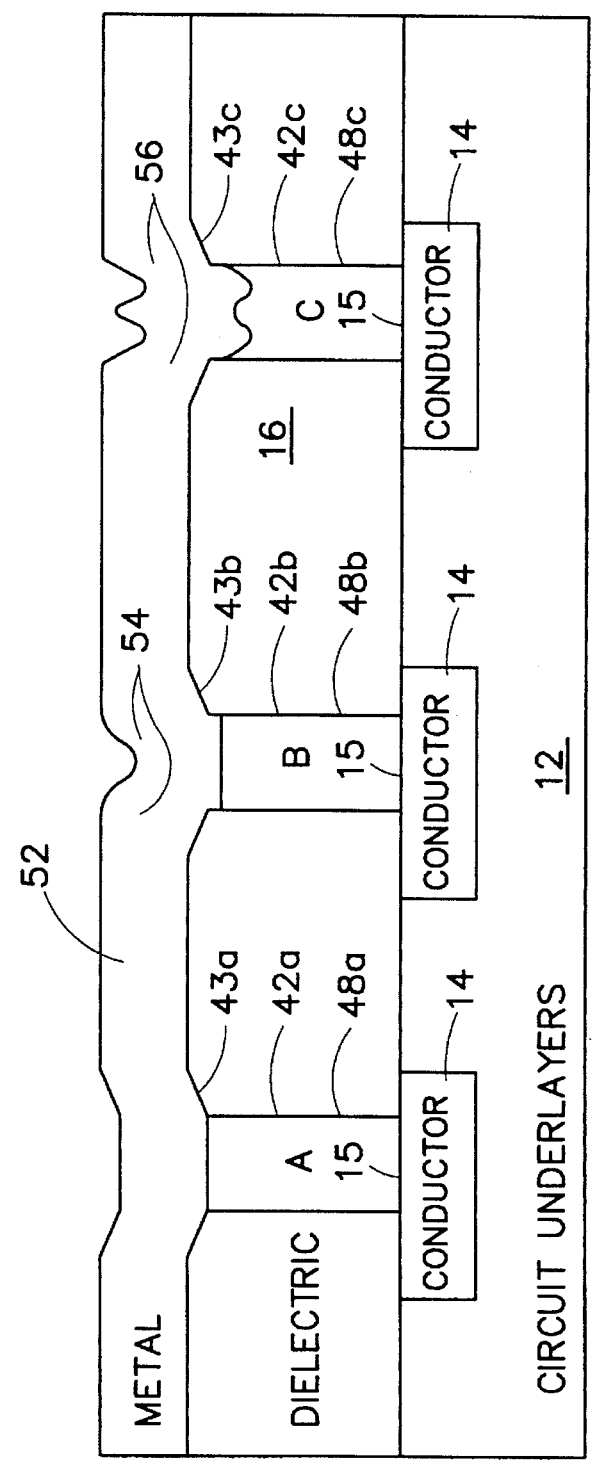
FIG. 6 illustrates the structure of FIG. 5 after an additional layer of metal has been formed thereon.

FIG. 6 shows the plugs of FIG. 5 after being covered by a metal deposition layer 52, which is typically aluminum copper. Note that in the case of contour "B" the step coverage is dramatically improved over that of FIG. 4, and there is no significant thinning at 54. In the case of contour "C" there is also a dramatic improvement in step coverage with no significant thinning at 56. In real applications, it is not unusual that the use of the taper process of the present invention doubles the subsequent step coverage compared to standard processing.

The present invention has been described by reference to a plug for connecting a conductor 14 to a metal layer 52. However, the present invention may also be used to form a contact for connection to the silicon substrate 12.

In the past, following via etch, wafers typically were subjected to a short argon plasma etch to clean the wafer surface prior to the first metal deposition. The purpose of the etch was only to clean the wafers and remove perhaps 50 to 100 angstroms of the surface. In a batch processing system this may require a few minutes of etching, but in a single wafer processing system, only a few seconds may be required. The purpose of the argon plasma etch of the present invention is to deliberately alter the contour of the via at the intersection of the vias with the dielectric surface. The sputtering process of the present invention which provides the taper may remove several thousand angstroms of the dielectric 16. Therefore in order to achieve the desired final dielectric thickness, the initial deposition of the dielectric must be thicker. Allowances must also be made for thicker photo resist, greater aspect ratios and other consequences that result from the thicker dielectric.

The process of the present invention may be readily incorporated into metal deposition processes. It is particularly useful in the case of existing metallization systems of the top down type which do not heat the wafer. Thus, an additional advantage of the present invention is that it provides a dramatic improvement in processing while continuing to use existing equipment.

The scope of the invention is to be indicated by the appended claims, rather than by the foregoing description.

We claim:

1. A process for forming an electrical interconnection system on a semiconductor, comprising the steps of:

providing a semiconductor substrate having an interconnection site;

forming a first insulating layer on said semiconductor substrate, said first insulating layer having an upper surface;

selectively etching a via in said first insulating layer at said interconnection site;

forming a first layer comprising a refractory metal on said insulating layer and in said via to contact said interconnection site;

partially removing said refractory metal layer until a surface of said refractory metal within said via is below said upper surface;

performing an etching process which removes a portion of said first insulating layer, simultaneously allowing for smoothing of said refractory metal surface, and whereby a tapered shape is formed at an intersection of said via and said upper surface; and forming a second layer of metal over said insulating layer, said second layer of metal extending into said via and contacting said refractory metal with said tapered shape providing improved step coverage of said second metal at said via.

2. A process as recited in claim 1 wherein said refractory metal comprises tungsten.

3. A process as recited in claim 2 wherein said second metal layer comprises an aluminum alloy.

4. A process as recited in claim 1 wherein said step of performing an etching process comprises performing a single wafer plasma etch in a sputter mode in an argon atmosphere for a first period of time.

5. A process as recited in claim 1 wherein said step of performing an etching process comprises performing a batch processing plasma etch in a sputter mode for a second period of time.

6. A process as recited in claim 1 wherein said interconnection site is at an interlevel metal layer.

7. A process as recited in claim 1 wherein said interconnection site is at a portion of said semiconductor substrate.

8. A process as recited in claim 7 wherein said refractory metal comprises tungsten and said second metal comprises an aluminum alloy.

9. In the manufacture of a semiconductor integrated circuit device, a process for making an electrical connection between an underlying first conductor and a second conductor, said first conductor separated from said second conductor by a dielectric layer, comprising the following steps:

forming a via in said dielectric, said via extending from a first surface of said dielectric to said first conductor, said via having a uniform cross section;

forming a first layer of tungsten over said dielectric layer, said tungsten extending into said via and making contact with said first conductor;

partially removing said first tungsten layer so that said tungsten is below said first dielectric surface at an edge of said via;

performing an etching process until said via has a tapered shape at said dielectric first surface, simultaneously allowing for smoothing of the tungsten surface; and forming a first layer of metal over said dielectric, said first layer of metal extending into said via and contacting said tungsten with said tapered shape allowing improved step coverage at said via.

10. A process as recited in claim 9 wherein said first layer of metal comprises an aluminum alloy.

11. A process as recited in claim 10 wherein said step of performing an etching process comprises performing a sputter etch in an argon atmosphere.

12. In the manufacture of a semiconductor integrated circuit device, a method for making an electrical connection between an underlying first conductor and a second conductor, said first conductor separated from said second conductor by a dielectric layer, comprising the following steps:

forming a via in said dielectric, said via extending from a first surface of said dielectric to said first conductor, said via having a uniform cross section;

forming a first layer of tungsten over said dielectric layer, said tungsten extending into said via and making contact with said first conductor;

partially removing said first tungsten layer so that said tungsten is below said first dielectric surface at an edge of said via;

sputter etching said dielectric until said via has a tapered shape at said dielectric first surface, simultaneously allowing for smoothing of the tungsten surface; and forming a first layer of an aluminum alloy over said dielectric, said first layer of aluminum alloy extending into said via and contacting said tungsten, with said tapered shape allowing improved step coverage at said via.

13. The method as recited in claim 12 wherein said step of sputter etching is performed in an argon atmosphere.

* * * * *